(12) United States Patent
Howard et al.

(10) Patent No.: US 6,828,996 B2
(45) Date of Patent: Dec. 7, 2004

(54) ELECTRON BEAM PATTERNING WITH A HEATED ELECTRON SOURCE

(75) Inventors: Glen E. Howard, Livermore, CA (US); William J. DeVore, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 09/888,256

(22) Filed: Jun. 22, 2001

(65) Prior Publication Data

US 2002/0195570 A1 Dec. 26, 2002

(51) Int. Cl.[7] .............................. B41J 2/435; H01J 1/20; H01J 19/14
(52) U.S. Cl. ...................................... 347/226; 313/337
(58) Field of Search ............................... 347/226, 225; 313/337, 448, 457, 631, 632; 250/492.3, 427, 492.24; 430/296; 330/4.7; 372/74; 219/121.2; 378/113, 121, 122, 136, 137, 138; 310/306

(56) References Cited

U.S. PATENT DOCUMENTS

| | | | |
|---|---|---|---|
| 3,283,810 A | * 11/1966 | Johnson et al. ............. | 356/307 |
| 3,864,572 A | 2/1975 | van der Mast et al. ..... | 250/306 |
| 4,019,077 A | 4/1977 | Sakitani ...................... | 313/441 |
| 4,588,928 A | * 5/1986 | Liu et al. ..................... | 315/382 |
| 4,910,442 A | 3/1990 | Ishizawa et al. ............ | 315/382 |
| 4,928,018 A | 5/1990 | Misium .................... | 250/492.2 |
| 4,945,247 A | 7/1990 | Kawasaki et al. ........ | 250/423 F |
| 4,968,894 A | 11/1990 | Misium .................... | 250/492.2 |
| 5,422,926 A | * 6/1995 | Smith et al. ................ | 378/121 |
| 5,942,834 A | * 8/1999 | Davis ......................... | 310/306 |
| 6,057,637 A | 5/2000 | Zettl et al. .................. | 313/310 |
| 6,215,128 B1 | * 4/2001 | Mankos et al. ........ | 250/492.24 |
| 6,448,568 B1 | * 9/2002 | Allen et al. ............ | 250/492.24 |

FOREIGN PATENT DOCUMENTS

| | | | | |
|---|---|---|---|---|
| JP | 5-159694 | * 6/1993 | ............. | H01J/1/13 |
| JP | 06181029 A | * 6/1994 | ............. | H01J/1/13 |
| WO | WO 96/02932 | * 7/1995 | ............. | H01J/29/62 |

* cited by examiner

Primary Examiner—Hai Pham
(74) Attorney, Agent, or Firm—Janah & Associates

(57) ABSTRACT

An electron source has an anode and a cathode that is capable of being negatively biased relative to the anode, the cathode having an electron emitting portion and a cathode axis. An electromagnetic radiation source is adapted to generate an electromagnetic radiation beam to heat the cathode. A lens is adapted to direct the electromagnetic radiation beam onto the cathode, the lens having a lens axis that forms an acute angle with, or is substantially parallel to, the cathode axis of the electron emitting portion.

38 Claims, 3 Drawing Sheets

ELECTRON BEAM PATTERNING WITH A HEATED ELECTRON SOURCE

BACKGROUND

Embodiments of the present invention relate to the registration of an electron beam pattern on a substrate.

An electron beam apparatus is capable of scanning one or more electron beams onto a substrate to register an electron beam pattern in electron-sensitive material on the substrate. A typical electron beam apparatus comprises a vacuum chamber comprising electron source, modulating, and detecting components. The electron source components generate electrons which are modulated and scanned across the substrate to register the electron beam pattern on the substrate. The electron beam may also be detected to determine the beam position relative to the substrate.

One commonly used electron source comprises a field-emission electron source. These sources have a conducting cathode with a tapered tip that is powered with a negative voltage relative to a nearby conducting anode. A resistor coil placed behind the tip may be provided to resistively heat the tip to thermally assist in the emission of electrons from the tip. However, conventional resistor coils typically radiate heat omnidirectionally and often only a small portion of the heat is actually transferred to the cathode tip. Thus, conventional resistor coils do not provide a very efficient method of heating the cathode tip. Also, the escaped heat may undesirably heat the walls and other components of the vacuum chamber. Additionally, the wires that carry power to the resistor coil can also pose a short-circuiting risk or can cause electrical or magnetic interference with other components inside the vacuum chamber.

An alternative electron source comprises a laser beam which is directed sideways onto the surface of the cathode tip, as disclosed in U.S. Pat. No. 3,864,572, which is incorporated herein by reference in its entirety. However, in this electron source, the cathode tip is heated non-uniformly because the laser beam illuminates only one side of the tip. Additionally, a portion of the laser beam is reflected off the tip, thereby reducing the heating efficiency. Furthermore, because the tip is small and tapered, it is difficult to align the laser beam to the tip, and the laser beam may be sometimes mis-directed. Still furthermore, the size and shape of this electron source makes it difficult to array in an electron beam apparatus. As a result, the electron source does not efficiently emit electrons and may also provide an inconsistent electron stream.

Thus, it is desirable to have an electron beam apparatus and electron source capable of efficiently heating an electron emitting cathode to generate a stream of electrons. It is also desirable for the electron beam apparatus to provide a reliable and consistent electron current during operation.

SUMMARY

An electron source comprises an anode; a cathode comprising an electron emitting portion and having a cathode axis; an electromagnetic radiation source adapted to generate an electromagnetic radiation beam to heat the cathode; and a lens adapted to direct the electromagnetic radiation beam onto the cathode, the lens having a lens axis that forms an acute angle with, or is substantially parallel to, the cathode axis.

An electron beam apparatus to register an electron beam pattern on a substrate comprises a vacuum chamber; a substrate support to support a substrate; an electron source to provide an electron beam in the vacuum chamber, the electron source comprising (a) an anode, (b) a cathode comprising an electron emitting portion and having a cathode axis, (c) an electromagnetic radiation source adapted to generate an electromagnetic radiation beam to heat the cathode, and (d) a lens adapted to direct the electromagnetic radiation beam onto the cathode, the lens having a lens axis that forms an acute angle with, or is substantially parallel to, the cathode axis; and an electron beam modulator and scanner to modulate and scan the electron beam across the substrate to register an electron beam pattern on the substrate.

A method of generating electrons from an electron source comprising an anode, and a cathode having an electron emitting portion and a cathode axis comprises (a) negatively biasing the cathode relative to the anode; and (b) directing an electromagnetic radiation beam onto the cathode at an acute angle with, or substantially parallel to, the cathode axis.

An electron source comprises an anode; a cathode comprising an electron emitting portion having a tip, a beam-receiving portion, and a cathode axis; a laser beam source adapted to generate a laser beam to heat the cathode; and a lens adapted to focus the laser beam onto the cathode, the lens being supported by a rod that is substantially parallel to the cathode axis and terminates in the electron emitting portion of the cathode.

A method of registering an electron beam pattern on a substrate comprises (a) placing a substrate on a substrate support; (b) generating an electron beam by (i) biasing a cathode relative to an anode, and (ii) generating an electromagnetic radiation beam and directing the electromagnetic radiation beam onto the cathode to heat the cathode; and (c) modulating and scanning the electron beam across the substrate to register an electron beam pattern on the substrate.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
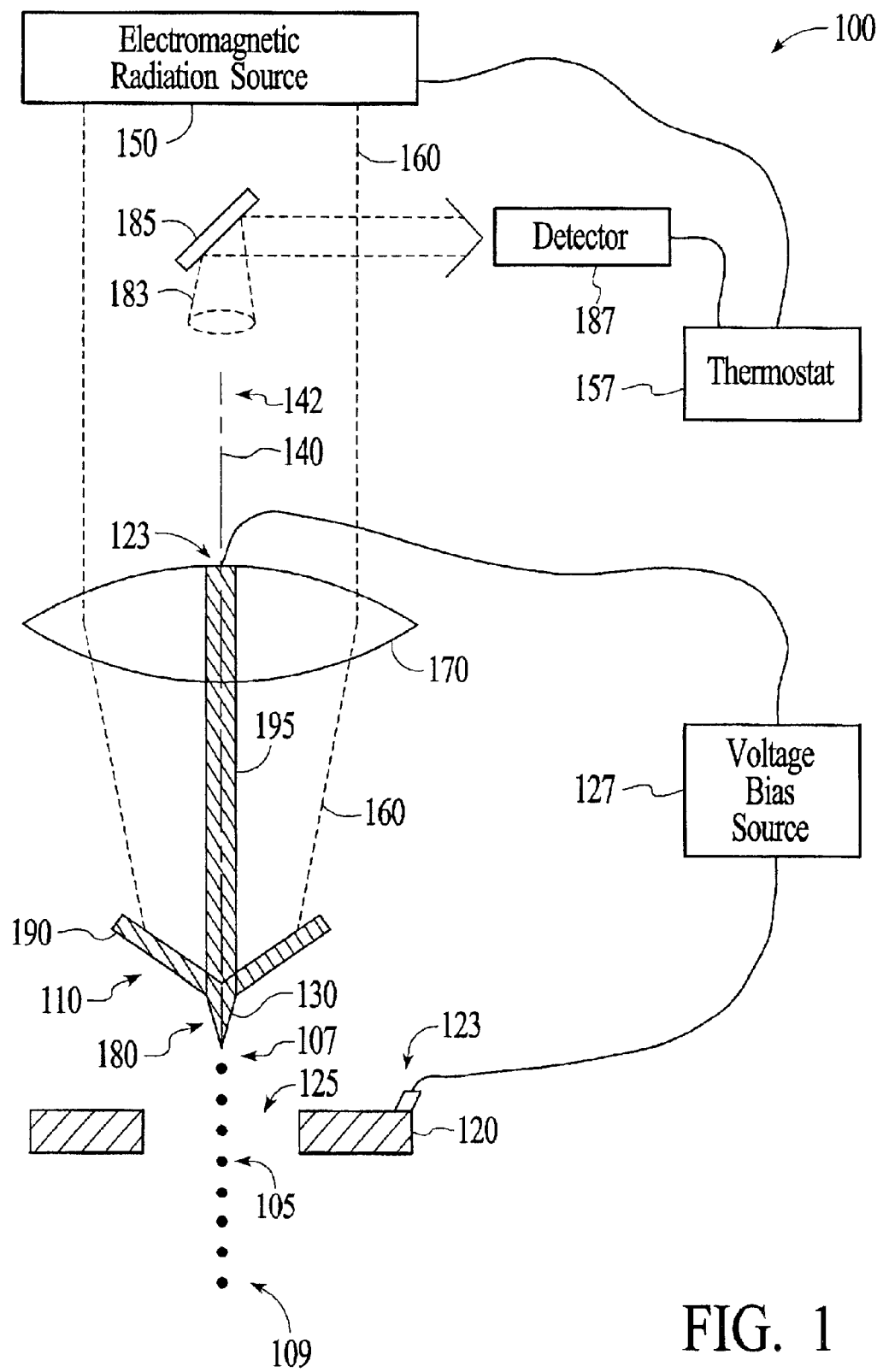
FIG. 1 is a schematic side view of an electron source according to the present invention.

Embodiments of an electron source according to the present invention are capable of emitting electrons that may be used for many different applications, including for example, to register an electron beam pattern on a substrate. In one embodiment, as illustrated in FIG. 1, the electron source 100 comprises an anode 120, and a cathode 110 capable of being negatively voltage biased relative to the anode 120. The cathode 110 and anode 120 typically comprise materials that can be voltage biased, such as electrically conducting materials, for example, a metal such as copper. The cathode 110 and anode 120 comprise one or more connection terminals 123 that are connected to a suitable voltage bias source 127 to maintain a voltage bias across the cathode 110 and the anode 120. The connection terminals 123 may comprise, for example, an alligator clip, solder joint, or ribbon connector. A suitable bias voltage source 127 is capable of providing a voltage of at least about 100 Volts, and more typically from about 200 Volts to about 500 Volts. Additionally, the cathode 110 and the anode 120 may together be floated at a source voltage, such as relative to the substrate. This source voltage is of a magnitude suitable to draw electrons 105 from the electron source 100, such as from about 100 V to about 100 kV, more typically from about 1 kV to about 50 kV.

The cathode 110 comprises an electron emitting portion 130 and has a cathode axis 140. For example, in the embodiment shown in FIG. 2, the cathode 110 has a cathode axis 140 about which the electron emitting portion 130 is substantially radially symmetrical. The electron emitting portion 130 may have a tapered portion 180 that is shaped as a cone or pyramid, and has a tip 107 with a sharp or rounded end. The electron emitting portion 130 is made from an electrically conducting material which has a low work function to enhance the emission of electrons 105 therefrom. For example, the electron emitting portion 130 may comprise tungsten or zirconium.

In operation, the voltage applied to the cathode 110 generates a concentrated, localized electric field at the tapered portion 180 of the electron emitting portion 130 to cause electrons 105 from the cathode 110 to escape through the tip 107 of the tapered portion 180 and follow the electric field lines (not shown) toward the positively biased anode 120. When the electrons 105 from the cathode 110 concentrate in the tapered portion 180, an electric field is produced near the tapered portion 180 that is more concentrated along a channel extending between the tapered portion 180 and the anode 120. This causes electrons 105 to escape the tip 107 and follow the electric field lines toward the anode 120 to form an electron beam 109 that is a stream of electron current. The electrons 105 may escape by tunneling across the potential barrier between the electron emitting portion 130 and the anode 120 or the electrons 105 may escape by being energized to an energy level that is equal to or greater than the electron work function.

In the embodiment of FIG. 1, the anode 120 comprises a conductor perforated by an aperture 125. The electron emitting portion 130 of the cathode 110 is positioned directly above the aperture 125 of the anode 120 so that the voltage bias applied to the cathode 110 and anode 120 can draw electrons 105 from the electron emitting portion 130 of the cathode 110 and into the aperture 125 of the anode 120. In one example, the anode 120 comprises a perforated plate made of a non-magnetic, temperature resistant material, such as molybdenum, tungsten, or titanium. While one cathode 110 and anode 120 arrangement is discussed, other suitable structures may also be used as would be apparent to one of ordinary skill in the art.

The electron source 100 further comprises an electromagnetic radiation source 150 adapted to generate an electromagnetic radiation beam 160 to heat the cathode 110. The electromagnetic radiation source 150 is an electrical, chemical, or mechanical device capable of generating an electromagnetic radiation beam 160. In a preferred version, the electromagnetic radiation source 150 comprises a light source, such as a LASER beam source (light amplification by stimulated emission of radiation), LED (light-emitting diode), or fluorescent lamp or incandescent lamp. The light source may comprise light radiation having components in the ultraviolet, visible or infrared wavelengths.

A lens 170 is provided to direct the electromagnetic radiation beam 160 onto the cathode 110 by focusing, shaping, or otherwise controlling the intensity distribution of the electromagnetic radiation beam 160 applied to the cathode 110. Typically, the lens 170 comprises a material that has a high permeability to the electromagnetic radiation beam 160 to minimize energy loss. For example, the lens material may be permeable to one or more frequencies of the electromagnetic radiation beam 160, such as frequencies that will efficiently transfer heat to the cathode 110. The lens 170 may comprise, for example, aluminum oxide, which may be in the form of polycrystalline alumina, sapphire, or ruby, and may also be doped with a material. The lens 170 may also comprise other materials that minimize energy loss of the electromagnetic radiation beam 160 or have a low coefficient of expansion.

In the embodiment shown in FIG. 1, the cathode 110 comprises a beam receiving portion 190, and the lens 170 is adapted to direct the radiation beam 160 onto the beam-receiving portion 190 of the cathode 110. In this embodiment, the lens 170 focuses the electromagnetic radiation beam 160 on the beam-receiving portion 190. In this version, the lens 170 may have a convex or biconvex shape. For example, the lens may be a drum lens, ball lens, or barrel lens. However, the lens 170 may also be adapted to spread and distribute the beam 160 across the surface of the beam-receiving portion 190, and in this version, the lens 170 has a concave or biconcave shape. The lens 170 may also be shaped to fit into the space of the beam-receiving portion 160, for example, if the beam-receiving portion 190 comprises a concave shaped surface that forms a recess, then the lens 170 may have a convex shape that is sized to fit into the concave shaped recess.

The lens 170 also has a lens axis 142 that is a principal direction of transmission of the electromagnetic radiation beam 160 through the lens 170. The lens axis 142 may also pass through one or more focal points of a simple lens; and for a compound lens, the lens axis 142 may pass through a median position of a plurality of focal points. In one version, the lens 170 is positioned so that the lens axis 142 is at an acute angle with, or is substantially parallel to, the cathode axis 140. An acute angle measures less than 90 degrees. This allows the lens 170 to direct substantially all the radiation beam 160 onto the beam-receiving portion 190 of the cathode 110, thereby, increasing the absorption efficiency of the radiation beam 160. In the version illustrated in FIG. 1, the lens axis 142 is substantially parallel to the cathode axis 140. In this version, almost all the energy of the radiation beam 160 is directed onto the beam-receiving portion 190 of the cathode 110 to increase the energy absorption. Furthermore, aligning the lens axis 142 and the cathode axis 140 gives the electron source 100 a compact shape that is suitable so that multiple electron sources 100 can be positioned in an array.

When the lens 170 directs the electromagnetic radiation beam 160 onto the beam-receiving portion 190, the beam-receiving portion 190 may be shaped to receive substantially all of the electromagnetic radiation beam 160. In one example, the beam-receiving portion 190 comprises a substantially concave surface to internally reflect portions of the electromagnetic radiation beam 160 to improve absorption of the electromagnetic radiation beam 160. In another example, the beam-receiving portion 190 is shaped to be substantially conical to receive a circularly-shaped radiation beam 160, such as a Gaussian beam, and uniformly conduct the heat generated by the beam 160 to the electron emitting portion 130. The beam-receiving portion 190 may be a different portion of the cathode 110 than the electron emitting portion 130 to allow energy to be received at a different area than the area from where the electrons are emitted. For example, the beam-receiving portion 190 may also comprise a surface that opposes a surface of the electron emitting portion 130. The beam-receiving portion 190 may also be made from a material suitable to absorb the energy of the radiation beam 160, such as for example, tungsten.

The electromagnetic radiation beam 160 is directed by the lens 170 onto the beam-receiving portion 190 of the cathode 110 to energize electrons 105 in the electron emitting portion 130 of the cathode 110 by heating the cathode 110. The distributed heat energy may be sufficiently high to increase the kinetic energies of the electrons 105 to near or greater than the electron work function of the electrons in the electron emitting portion 130. The heat energy may also serve to improve electron emission by facilitating tunneling across the potential barrier between the electron emitting portion 130 and the anode 120. The heat energy can also provide a smaller driving force to overcome the electron binding force, because the electron energy levels reach or exceed their work function. Thus, the cathode 110 is heated to a temperature sufficiently high to improve the operation of the electron source 100, and stabilize electron emission, and energize electrons 105 sufficiently to produce a desired electron current. For example, the electromagnetic radiation source 150 may be adapted to heat the cathode 110 to at least about 1800 Kelvin.

A rod 195 may be used to connect the lens 170 and the beam-receiving portion 190 of the cathode 110. The rod 195 maintains the relative positions of the beam-receiving portion 190 and the lens 170 to allow proper illumination of the beam-receiving portion 190. The rod 195 may, for example, pass along the cathode axis 140 of the electron emitting portion 130, from the electron emitting portion 130 to the lens 170. The rod 195 may comprise a material having a good tensile strength, such as tungsten. Preferably, the rod 195 is thin so that it does not obstruct the electromagnetic radiation beam 160, thereby providing a higher electromagnetic radiation beam absorption efficiency at the beam-receiving portion 190 of the cathode 110. In another embodiment, the rod 195 absorbs the electromagnetic radiation beam 160 and transfers the heat to the electron emitting portion 130. Additionally, the rod 195 may be attached to the lens 170 or the electron emitting portion 130 by a fastener or an adhesive.

When temperature control is desirable, a thermostat 157 that uses a temperature measurement feedback loop to control the electromagnetic radiation source 150 may be used to maintain the cathode 110 at the desired temperature. The thermostat 157 uses a mechanical, thermal, or electrical feedback loop to monitor and adjust the electromagnetic radiation source 150 to control the heat applied to the cathode 110. The electromagnetic radiation source 150 is controlled to apply an average level of illumination to the cathode 110 to set the temperature of the cathode 110 to within an acceptable range. When the temperature of the cathode 110 goes below or above the desired setpoint range, the electromagnetic radiation source 150 is powered down or up to decrease or increase the intensity of the electromagnetic radiation beam 160 applied to the cathode 110, respectively.

In one embodiment, reflected electromagnetic radiation 183 from the cathode 110 or the rod 195 is detected by an electromagnetic radiation detector 187 and used to determine a property of the electron source 100. For example, the reflected electromagnetic radiation 183 may also be detected to determine the temperature of the cathode 110 by modeling the material of the cathode 110 as a blackbody and correlating the electromagnetic spectrum emitted therefrom with its temperature. In another embodiment, the reflected electromagnetic radiation 183 is detected to determine the remaining operational lifetime of the cathode 110. The reflected electromagnetic radiation 183 may be reflected toward the electromagnetic radiation detector 187 by a one-way mirror 185, such as positioned on the cathode axis.

Figure 2:
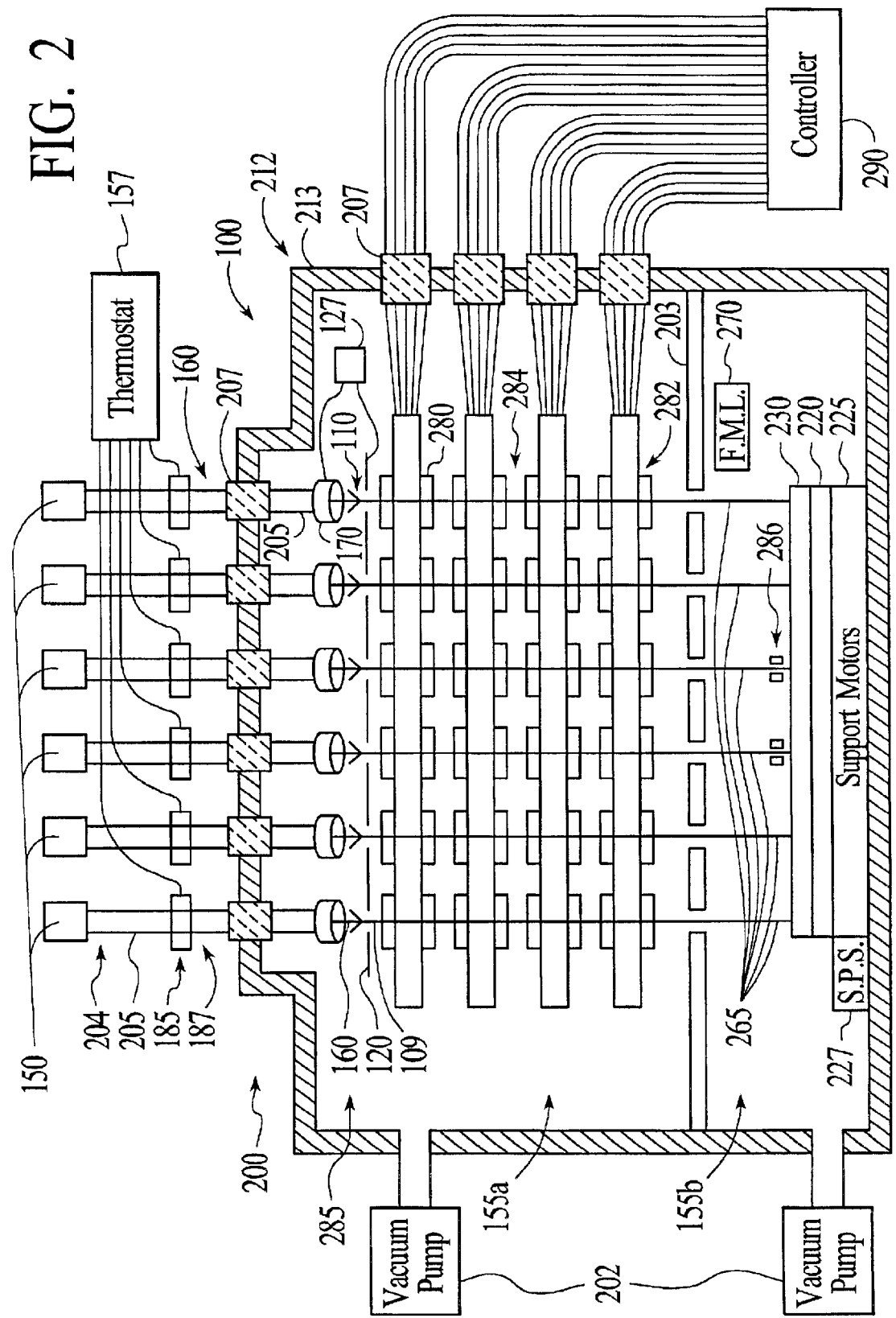
FIG. 2 is a schematic side view of an electron beam apparatus comprising an electron source according to the present invention.

The electron source 100 according to the present invention may be used in many different applications as would be apparent to one of ordinary skill in the art. For example, the electron source 100 may be used in an electron beam apparatus 200 according to the present invention, an exemplary version of which is illustrated in FIG. 2. The electron beam apparatus 200 may be used to register the electron beam pattern on a substrate 230. Thus, the illustrative apparatus 200 provided herein should not be used to limit the scope of the invention, and the invention encompasses equivalent or alternative versions, as would be apparent to one of ordinary skill in the art.

In operation, the apparatus 200 registers an electron beam pattern on a substrate 230. Typically, the substrate 230 comprises one or more dielectric, semiconducting, or conducting materials, including, for example, metal, polymer, or ceramic materials, which may be formed as layers of the substrate 230. The substrate 230 may comprise, for example, a blank mask comprising a transparent plate of glass or quartz, that is coated with a resist layer and a chrome layer; a silicon wafer; a compound semiconductor wafer; a printed circuit board (PCB); or a multichip module (MCM). The electron beam patterns registered on the substrate 230 may be a pattern of an integrated circuit (IC) or a circuit layout of a PCB. After registration of an electron beam pattern on the substrate 230, the layers are etched to form features (not shown) such as electrically interconnecting wiring or vias, or active or passive devices, such as for example, resistors, transistors, and capacitors. The features may be shaped as, for example, lines, plugs, cavities, channels, holes and trenches, which are shaped and patterned according to the electron beam pattern registered on the substrate 230.

Generally, the electron beam apparatus 200 comprises a vacuum chamber 212 adapted to provide one or more vacuum environments 155$a,b$ to generate an electron beam for registering the electron beam pattern on the substrate 230. The vacuum chamber 212 comprises walls 213 that are substantially vacuum-tight during operation of the apparatus 200 and are made of a material suitable to enclose the vacuum environments 155$a,b$, such as aluminum. One or more vacuum pumps 202 are provided to evacuate the chamber 212 to create and maintain the vacuum environments 155$a,b$. In one embodiment, the vacuum pumps 202 provide a first vacuum environment 155$a$ at the top portion of the vacuum chamber 212, and a second vacuum environment 155$b$ which may maintain a different gas pressure at the bottom portion of the vacuum chamber 212. For example, the first vacuum environment 155$a$ may maintain a gas pressure of about $10^{-9}$ Torr and the second vacuum environment 155$b$ may maintain a gas pressure of about $10^{-6}$ Torr. A pressure barrier 203 may also be provided between the vacuum environments 155$a,b$ to help maintain the pressure difference.

The apparatus 200 further comprises one or more apparatus components 285 that form an electron source 100, electron detector 286, and electron beam modulator and scanner 280, which cooperate to generate, modulate, scan, and detect an electron beam 265 that is directed along a beam pathway 284 toward the substrate 230. An electron source 100 according to the present invention is positioned in the vacuum chamber 212 so that the emitted electrons 105 are directed to and can be modulated and scanned by the modulator and scanner 280.

The electromagnetic radiation source 150 of the electron source 100 may be positioned inside or outside the vacuum chamber 212. In the embodiment shown in FIG. 2, the electromagnetic radiation source 150 is outside the chamber 212 and the electromagnetic radiation beam 160 is passed into the vacuum chamber 212 by means of one or more transmission conduits 204 passing through a wall 213 of the vacuum chamber 212. The transmission conduit 204 comprises a conduit that is transmissive to one or more frequencies of the electromagnetic radiation. It may comprise, for example, an optical fiber 205 or a radiation permeable window. The transmission conduit 204 may also be surrounded by a vacuum feedthrough 207 to maintain a gas-tight seal around the transmission conduit 204. The vacuum feedthrough 207 may comprise a shape suitable to maintain the gas-tight seal, for example, an O-ring, adhesive sealing tape, or a metal gasket, or a material also suitable to maintain the gas-tight seal, such as rubber or a deformable metal. In the version illustrated in FIG. 2, the transmission conduit 204 comprises an optical fiber 205 that passes inside the vacuum chamber 212 to guide an electromagnetic radiation beam 160 to the lens 170 of the electron source 100.

Generally, multiple electron beams 265 allow faster and more efficient registration of the substrate 230 than a single electron beam because of simultaneous delivery and/or shorter electron beam scan distances. The electron beam pathway 284 may be a straight line, a curved line, a series of connected straight lines, or any other pathway 284 traversed by the electron beams 265. Thus, the electron beam column 282 may be vertically oriented in a column above the substrate 230 (as shown), or may be oriented in an angled configuration (not shown), such as a right-angled configuration, or may be oriented in a curved configuration (also not shown). The electron beam modulator 280 may include one or more electron beam lens, demagnifier, accelerator, or deflector. The deflector may be electrostatic or magnetic electron beam deflectors.

The apparatus 200 also comprises a substrate support 220 capable of supporting a substrate 230. The support 220 may comprise an electrostatic chuck (not shown) capable of holding the substrate 230 against the support 220. The apparatus 200 may also comprise support motors 225 capable of moving the support 220 to precisely position the substrate 230 in relation to the apparatus 200 or to move the substrate 230 to scan the electron beams 265 across the substrate 230. For example, the support motors 225 may comprise electric motors that translate the support 220 in the x and y directions along an x-y plane parallel to the substrate surface, rotate the support 220, elevate or lower the support 220, or tilt the support 220. The apparatus 200 may further comprise support position sensors 227 capable of precisely determining the position of the support 220. For example, the support position sensors 227 may reflect a light beam (not shown) from the support 220 and detect the reflected beam, where the travel time indicates the distance between the support 220 and the support position sensors 227.

The apparatus 200 may further comprise a fiducial mark locator 270 capable of locating fiducial marks (not shown) on the substrate 230. The fiducial marks may be used as reference points of the substrate 230. For example, the fiducial marks of the substrate 230 may be useful for correcting an electron beam pattern to be registered on the substrate 230. Fiducial marks may move relative to their intended locations during processing of the substrate 230. The degree of movement or misalignment of the fiducial marks may vary at different regions of the substrate 230 depending upon the localized stresses or distortions of the substrate 230, or the apparatus that placed the fiducial mark.

Figure 3:
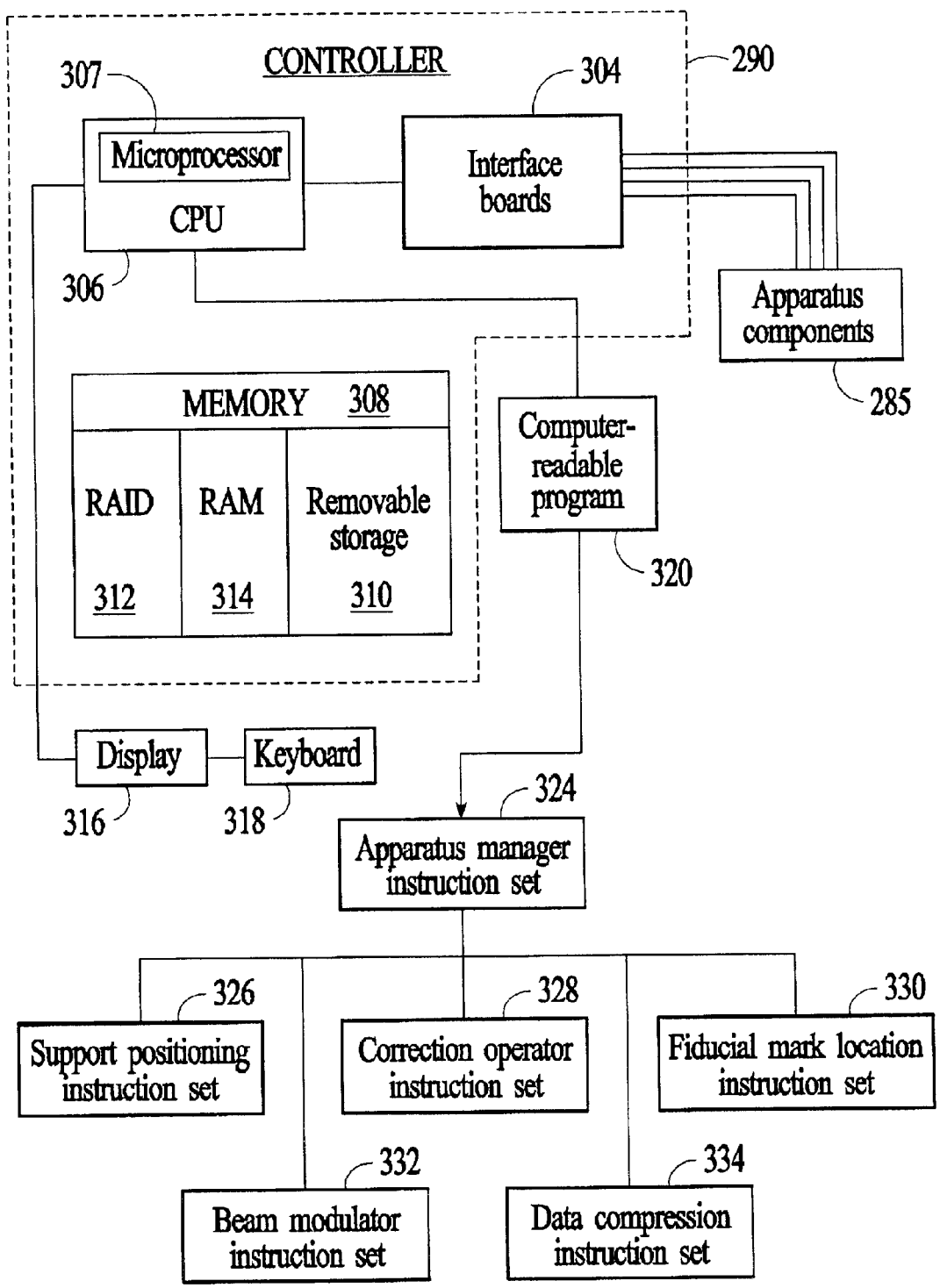
FIG. 3 is a block diagram of a controller and computer-readable program for operating the electron beam apparatus.

The apparatus 200 further comprises a controller 290 comprising a suitable configuration of hardware and software to operate the apparatus components 285 to process and register an electron beam pattern on the substrate 230. An exemplary controller 290 is illustrated in FIG. 3. For example, the controller 290 may comprise a central processing unit (CPU) 306 that is connected to a memory 308 and other components. The CPU 306 comprises a microprocessor 307, such as a complex instruction set computer (CISC) microprocessor, for example a Pentium (TM) microprocessor commercially available from Intel Corporation, Santa Clara, Calif., or a reduced instruction set computer (RISC) microprocessor, capable of executing a computer-readable program 320. The memory 308 may comprise a computer-readable medium such as hard disks in a redundant array of independent disks (RAID) configuration 312, removable storage 310 such as an optical compact disc (CD) or floppy disk, random access memory (RAM) 314, and/or other types of volatile or nonvolatile memory. The interface between a human operator and the controller 290 can be, for example, via a display 316, such as a cathode ray tube (CRT) monitor, and an input device, such as a keyboard 318. The controller 290 may also include interface boards 304 such as analog and digital input/output boards, linear motor driver boards, or stepper motor controller boards.

The computer-readable program 320 generally comprises software comprising sets of instructions to operate the apparatus components 285, and an apparatus manager instruction set 324 to manage the instruction sets. The computer-readable program 320 can be written in any conventional programming language, such as for example, assembly language, C, C++ or Pascal. Suitable program code is entered into a single file, or multiple files, using a conventional text editor and stored or embodied in the memory 308 of the controller 290. If the entered code text is in a high level language, the code is compiled, and the resultant compiler code is then linked with an object code of pre-compiled library routines. To execute the linked, compiled object code, the user invokes the feature code, causing the CPU 306 to read and execute the code to perform the tasks identified in the computer-readable program 320. Using a keyboard interface, a human user enters commands or registration parameters into the computer readable program 320 in response to menus or screens displayed on the display 316. The computer-readable program 320 may include instruction sets to, for example, control the support positioning 326, correction operators 328, fiducial mark location 330, beam modulation 332, and data compression 334. The instruction sets may receive parameters, such as a data file corresponding to the electron beam pattern, the fiducial mark locations, the support position, or instructions entered by the human operator.

The controller 290 is adapted to generate, send, and receive signals to operate the apparatus components 285 to register an electron beam pattern on the substrate 230. For example, the controller 290 may send signals to the beam modulator 280 to control modulation of the electron beams 265 to the desired intensity levels and in correspondence to the electron beam pattern bitmap. The beam modulator 280 may also be controlled to scale the electron beam pattern in the scanning direction by timing the beam pulses, and the support motors 225 may also receive real-time instructions from the controller 290 to control the motion of the substrate 230 to scale, rotate, or offset the electron beam pattern registered on the substrate 230. As another example, the controller 290 may also operate the fiducial mark locator 270 by receiving measured locations of the fiducial marks and comparing them to their intended locations to determine the deviation of each fiducial mark.

In operation, a substrate 230 is placed on the substrate support 220. Electron beams 265 are generated by negatively biasing the cathode 110 of the electron source 100 relative to the anode 120, and directing an electromagnetic radiation beam 160 onto the beam-receiving portion 190 of the cathode 110 to heat the cathode 110. In one version, the electromagnetic radiation beam 160 is directed at an acute angle or substantially parallel with the cathode axis 140. For example, the electromagnetic radiation beam 160 may be focused on the beam-receiving portion 190 of the cathode 110. The electromagnetic radiation beam 160 may be capable of heating the cathode to at least about 1800 Kelvin. Electrons are generated and formed into the electron beams 265, which are modulated to register the electron beam pattern on the substrate 230.

The electron beam apparatus 200 advantageously provides increased electron generation efficiency. For example, the electron source 100 of the electron beam apparatus 200, may achieve an efficiency as high as about twice that of a conventional electron source 100, use a low power level of about 1 W of power, and draw an electron current of about 1 Amp.

Although the present invention has been described in considerable detail with regard to certain preferred versions thereof, other versions are possible. For example, the present invention could be used with other electron beam apparatuses, such as an apparatus that inspects a substrate using electron beams. For example, the electron source 100 may also comprise other equivalent configurations as would be apparent to one of ordinary skill in the art. As another example, the electron source 100 may comprise a plurality of cathodes 110 and anodes 120. Thus, the appended claims should not be limited to the description of the preferred versions contained herein.

What is claimed is:

1. An electron source comprising:
   an anode;
   a cathode comprising a beam-receiving portion and an electron emitting portion, the boom-receiving portion having a substantially concave or substantially conical surface, the electron emitting portion having a tapered tip;
   an electromagnetic radiation source adapted to generate an electromagnetic radiation beam to heat the cathode; and
   a lens adapted to direct the electromagnetic radiation beam onto the substantially concave or substantially conical surface of the beam-receiving portion of the cathode,
   whereby electrons are emitted from the electron emitting portion.

2. An electron source according to claim 1 wherein the electron omitting portion comprises tungsten.

3. An electron source according to claim 1 wherein the cathode comprises a rod that terminates in the electron emitting portion, and wherein the lens is attached to the rod.

4. An electron source according to claim 1 wherein the electromagnetic radiation source is adapted to heat the cathode to at least about 1800 Kelvin.

5. An electron source according to claim 1 wherein the lens comprises aluminum oxide.

6. An electron source according to claim 1 comprising an electromagnetic radiation detector to detect radiation reflected from the cathode to determine a property of the cathode.

7. An electron source according to claim 1 wherein the cathode has a cathode axis, and wherein the lens has a lens axis that forms an acute angle with, or is substantially parallel to, the cathode axis.

8. An electron beam apparatus to register an electron beam pattern on a substrate, the apparatus comprising:
   a vacuum chamber;
   a substrate support to support a substrate;
   an electron source to provide an electron beam in the vacuum chamber, the electron source comprising (a) an anode, (b) a cathode comprising a beam-receiving portion and an electron emitting portion, the beam-receiving portion having a substantially concave or substantially conical surface, (c) an electromagnetic radiation source adapted to generate an electromagnetic radiation beam to heat the cathode, and (d) a lens adopted to direct the electromagnetic radiation beam onto the substantially concave or substantially conical surface of the beam-receiving portion of the cathode; and
   an electron beam modulator and scanner to modulate and scan the electron beam across the substrate to register an electron beam pattern on the substrate, whereby electrons are emitted from the electron emitting portion.

9. An apparatus according to claim 8 wherein the electron emitting portion comprises tungsten.

10. An apparatus according to claim 8 comprising a rod that connects the lens and the beam-receiving portion of the cathode.

11. An apparatus according to claim 8 wherein the electromagnetic radiation source is adapted to heat the cathode to at least about 1800 Kelvin.

12. An apparatus according to claim 8 wherein the lens comprises aluminum oxide.

13. An apparatus according to claim 8 wherein the electron source comprises an electromagnetic radiation detector to detect electromagnetic radiation emitted from the cathode to determine a property of the cathode.

14. An apparatus according to claim 8 wherein the cathode has a cathode axis, and wherein the lens has a lens axis that forms an acute angle with, or is substantially parallel to, the cathode axis.

15. A method of generating electrons from an electron source comprising an anode and a cathode, the cathode having an electron emitting portion and a beam receiving portion, the electron emitting portion having a tapered tip, the beam receiving portion having a substantially concave or substantially conical surface, the method comprising:
   (a) negatively biasing the cathode relative to the anode to generate a localized electric field at the tapered tip of the electron emitting portion of the cathode; and
   (b) heating the cathode by directing an electromagnetic radiation beam onto the substantially concave or substantially conical surface of the beam receiving portion of the cathode.

16. A method according to claim 15 comprising detecting a radiation reflected from the cathode and determining a property of the cathode.

17. An electron source comprising:

an anode;

a cathode comprising an electron emitting portion having a tip, a beam-receiving portion, and a cathode axis;

a laser beam source adapted to generate a laser beam to heat the cathode; and a lens adapted to focus the laser beam onto the cathode, the lens being supported by a rod that is substantially parallel to the cathode axis and terminates in the electron emitting portion of the cathode.

18. An electron source according to claim 17 wherein the lens comprises a lens axis that forms an acute angle with or is substantially parallel to, the cathode axis.

19. An electron source according to claim 17 wherein the beam-receiving portion is a different portion of the cathode than the electron emitting portion.

20. An electron source according to claim 17 wherein the beam-receiving portion comprises a substantially concave or substantially conical surface.

21. An electron source according to claim 17 wherein the electron emitting portion comprises tungsten.

22. An electron source according to claim 17 wherein the electromagnetic radiation source is adapted to heat the cathode to at least about 1800 Kelvin.

23. An electron source according to claim 17 wherein the lens comprises aluminum oxide.

24. An electron source according to claim 17 comprising an electromagnetic radiation detector to detect radiation reflected from the cathode to determine a property of the cathode.

25. A method of registering an electron beam pattern on a substrate, the method comprising:

(a) placing a substrate on a substrate support;

(b) generating an electron beam by (i) biasing a cathode relative to an anode, and (ii) generating an electromagnetic radiation beam and directing the electromagnetic radiation beam onto a substantially concave or substantially conical surface of a beam receiving portion of the cathode; and (c) modulating and scanning the electron beam across the substrate to register an electron beam pattern on the substrate.

26. An electron source comprising:

an anode;

a cathode comprising an electron emitting portion and a rod that terminates in tho electron emitting portion;

an electromagnetic radiation source adapted to generate an electromagnetic radiation beam to heat the cathode; and a lens attached to the rod and adapted to direct the electromagnetic radiation beam onto the cathode, whereby electrons are emitted from the electron emitting portion.

27. An electron beam apparatus to register an electron beam pattern on a substrate, the apparatus comprising:

a vacuum chamber;

a substrate support to support a substrate;

an electron source to provide on electron beam in the vacuum chamber, the electron source comprising (a) an anode, (b) a cathode comprising an electron emitting portion and a rod that terminates in the electron emitting portion, (c) an electromagnetic radiation source adapted to generate an electromagnetic radiation beam to heat the cathode, and (d) a lens attached to the rod and adapted to direct the electromagnetic radiation beam onto the cathode; and an electron beam modulator and scanner to modulate and scan the electron beam across the substrate to register an electron beam pattern on the substrate, whereby electrons are emitted from the electron emitting portion.

28. A method of generating electrons from an electron source comprising an anode and a cathode, the cathode having an electron emitting portion and a beam receiving portion, the electron emitting portion having a tapered tip, the method comprising:

(a) negatively biasing the cathode relative to the anode to generate a localized electric field at the tapered tip of the electron emitting portion of the cathode;

(b) directing an electromagnetic radiation beam onto the beam receiving portion of the cathode to heat the cathode; and (c) determining a temperature of the cathode and adjusting the electromagnetic radiation beam to control the amount of heat applied to the cathode to maintain the cathode at a setpoint temperature.

29. A method according to claim 28 wherein the setpoint temperature is at least about 1800 Kelvin.

30. A method according to claim 28 comprising negatively biasing the cathode relative to the anode at a voltage bias magnitude of about 1 kV to about 50 kV.

31. An electron source comprising:

an anode;

a cathode comprising an electron emitting portion having a tapered tip;

an electromagnetic radiation source adapted to generate an electromagnetic radiation beam to heat the cathode;

a lens adapted to direct the electromagnetic radiation beam onto the cathode; and a thermostat adapted to determine a temperature of the cathode and adjust the amount of heat applied to the cathode by adjusting the electromagnetic radiation beam, whereby electrons are emitted from the tapered tip of the electron emitting portion.

32. An electron source comprising:

an anode;

a cathode comprising an electron emitting portion having a tapered tip;

an electromagnetic radiation source adapted to heat the cathode to at least about 1800 Kelvin by generating an electromagnetic radiation beam; and a lens adapted to direct the electromagnetic radiation beam onto the cathode, whereby electrons are omitted from the tapered tip of the electron emitting portion.

33. An electron source according to claim 32 comprising a voltage bias source capable of biasing the cathode to generate a localized electric field at the tapered tip of the electron emitting portion of the cathode.

34. An electron source comprising:

anode;

a cathode comprising an electron emitting portion and a beam-receiving portion, the electron emitting portion having a tapered tip, the beam-receiving portion consisting essentially of metal;

an electromagnetic radiation source adapted to generate an electromagnetic radiation beam to heat the cathode; and a lens adapted to direct the electromagnetic radiation beam onto the beam-receiving portion of the cathode, whereby electrons are emitted from the tapered tip of the electron emitting portion.

35. An electron beam apparatus to register an electron beam pattern on a substrate, the apparatus comprising:

a vacuum chamber;

a substrate support to support a substrate;

an electron source to provide an electron beam in the vacuum chamber, the electron source comprising (a) an anode, (b) a cathode comprising an electron emitting portion and a beam-receiving portion, the electron emitting portion having a tapered tip, the beam-receiving portion consisting essentially of metal, (c) an electromagnetic radiation source adapted to generate an electromagnetic radiation beam to heat the cathode, and (d) a lens adapted to direct the electromagnetic radiation beam onto the beam-receiving portion of the cathode; and an electron beam modulator and scanned to modulate and scan the electron beam across the substrate to register an electron beam pattern on the substrate, whereby electrons are emitted from the tapered tip of the electron emitting portion.

36. An electron beam apparatus according to claim 35 comprising a voltage bias source capable of biasing the cathode to generate a localized electric field at the tapered tip of the electron emitting portion of the cathode.

37. A method of generating electrons from an electron source comprising an anode and a cathode, the cathode having an electron emitting portion and a beam receiving portion, the electron emitting portion having a tapered tip, the method comprising:

(a) negatively biasing the cathode relative to the anode to generate a localized electric field at the tapered tip of the electron emitting portion of the cathode; and (b) directing an electromagnetic radiation beam onto the beam receiving portion of the cathode to heat the cathode.

38. A method according to claim 37 comprising directing an electromagnetic radiation beam onto a different portion of the cathode than the electron emitting portion.

* * * * *